United States Patent
Hung (10) Patent No.: US 10,492,335 B1
(45) Date of Patent: Nov. 26, 2019

(54) HEAT DISSIPATION DEVICE FOR PLUGGABLE DEVICE OR MODULE

(71) Applicant: NANNING FUGUI PRECISION INDUSTRIAL CO., LTD., Nanning (CN)

(72) Inventor: Wei-Chih Hung, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 0 days.

(21) Appl. No.: 16/211,731

(22) Filed: Dec. 6, 2018

(51) Int. Cl.
*H05K 7/20* (2006.01)
*H05K 7/14* (2006.01)

(52) U.S. Cl.
CPC ....... *H05K 7/20454* (2013.01); *H05K 7/2049* (2013.01); *H05K 7/20418* (2013.01); *H05K 7/20509* (2013.01); *H05K 7/1427* (2013.01)

(58) Field of Classification Search
CPC ...................................... H01L 23/34
USPC ............ 361/679.46–679.54; 165/80.1–80.3; 257/718–719; 24/453, 458–459
See application file for complete search history.

(56) References Cited

U.S. PATENT DOCUMENTS

| | | | |
|---|---|---|---|
| 8,879,262 B2* | 11/2014 | Shi | G02B 6/4246 165/104.33 |
| 9,445,528 B2* | 9/2016 | Cohen | G06F 1/20 |
| 9,474,188 B2* | 10/2016 | Moore | H05K 3/301 |
| 9,787,034 B2* | 10/2017 | Yang | G02B 6/3817 |
| 10,310,198 B1* | 6/2019 | Yatskov | G02B 6/4269 |
| 2005/0220425 A1* | 10/2005 | Kropp | G02B 6/4292 385/88 |
| 2009/0296350 A1* | 12/2009 | Oki | G02B 6/4201 361/709 |
| 2015/0029667 A1* | 1/2015 | Szczesny | F28D 15/0275 361/700 |
| 2017/0150645 A1* | 5/2017 | Huang | F25B 21/02 |
| 2017/0168249 A1* | 6/2017 | Maeda | G02B 6/4206 |

* cited by examiner

*Primary Examiner* — Dion Ferguson
*Assistant Examiner* — Amir A Jalali
(74) *Attorney, Agent, or Firm* — ScienBiziP, P.C.

(57) ABSTRACT

A heat dissipation device for a device or module which can be plugged into the heat dissipation device includes a mounting bracket, an upper radiator, and at least one side radiator. The mounting bracket includes an upper bracket and two side brackets connected to two sides of the upper bracket. The upper bracket and the two side brackets define a receiving chamber for receiving the device or module. The upper radiator is positioned above the upper bracket. The at least one side radiator is positioned at one side of the side bracket away from the receiving chamber. The upper radiator includes a heat conducting layer, and the heat conducting layer includes a thermally conductive foam and a graphite layer arranged around the thermally conductive foam.

9 Claims, 7 Drawing Sheets

HEAT DISSIPATION DEVICE FOR
PLUGGABLE DEVICE OR MODULE

FIELD

The disclosure generally relates to heat dissipation for independent or peripheral devices.

BACKGROUND

Heat dissipation device for pluggable module can include a cooling fan, and the cooling fan carries out heat dissipation by forced convection to the pluggable module. The heat dissipation device with the fan is complex, and the heat dissipation efficiency is low. Therefore, there is room for improvement within the art.

BRIEF DESCRIPTION OF THE DRAWINGS

Many aspects of the present disclosure can be better understood with reference to the drawings. The components in the drawings are not necessarily drawn to scale, the emphasis instead being placed upon clearly illustrating the principles of the disclosure. Moreover, in the drawings, like reference numerals designate corresponding parts throughout the views.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

Figure 1:
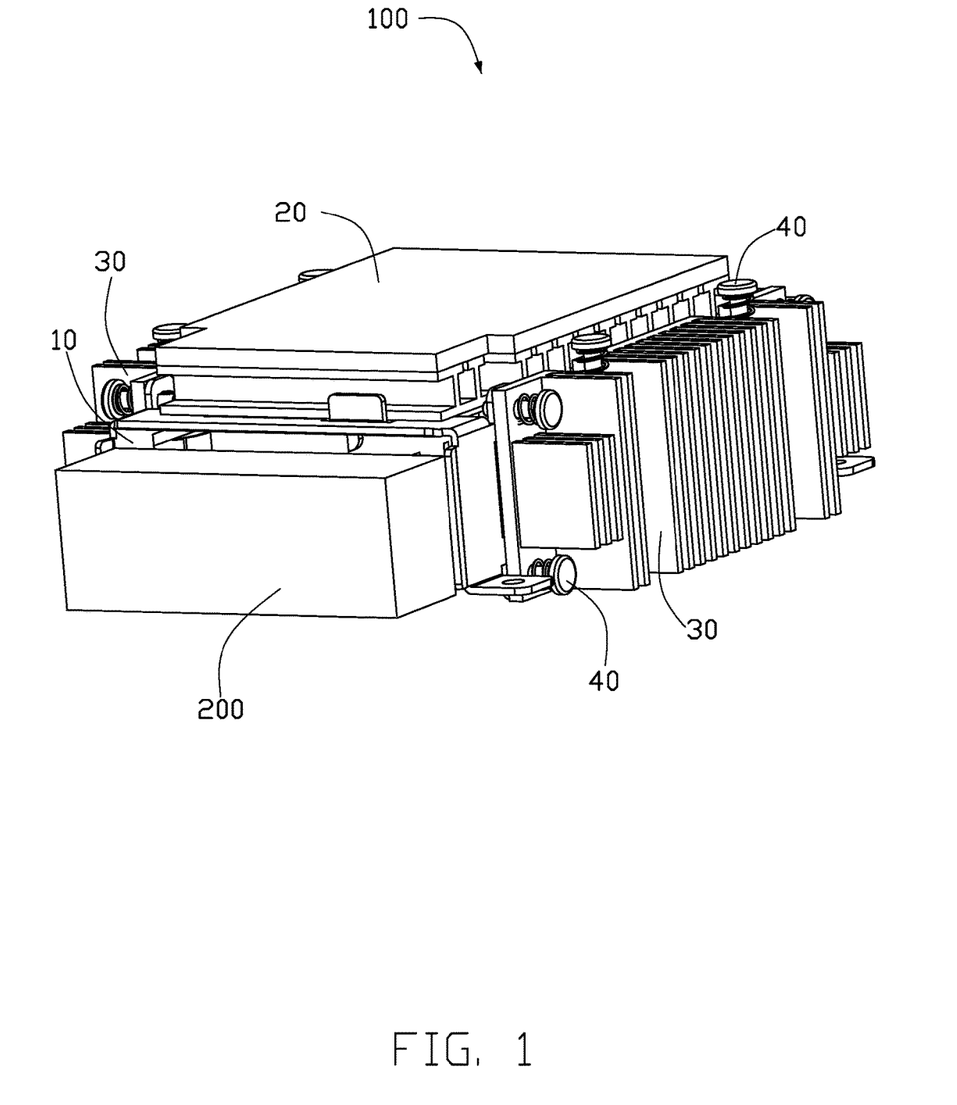
FIG. 1 is an isometric view of an embodiment of a heat dissipation device mounted to a pluggable module.
Figure 2:
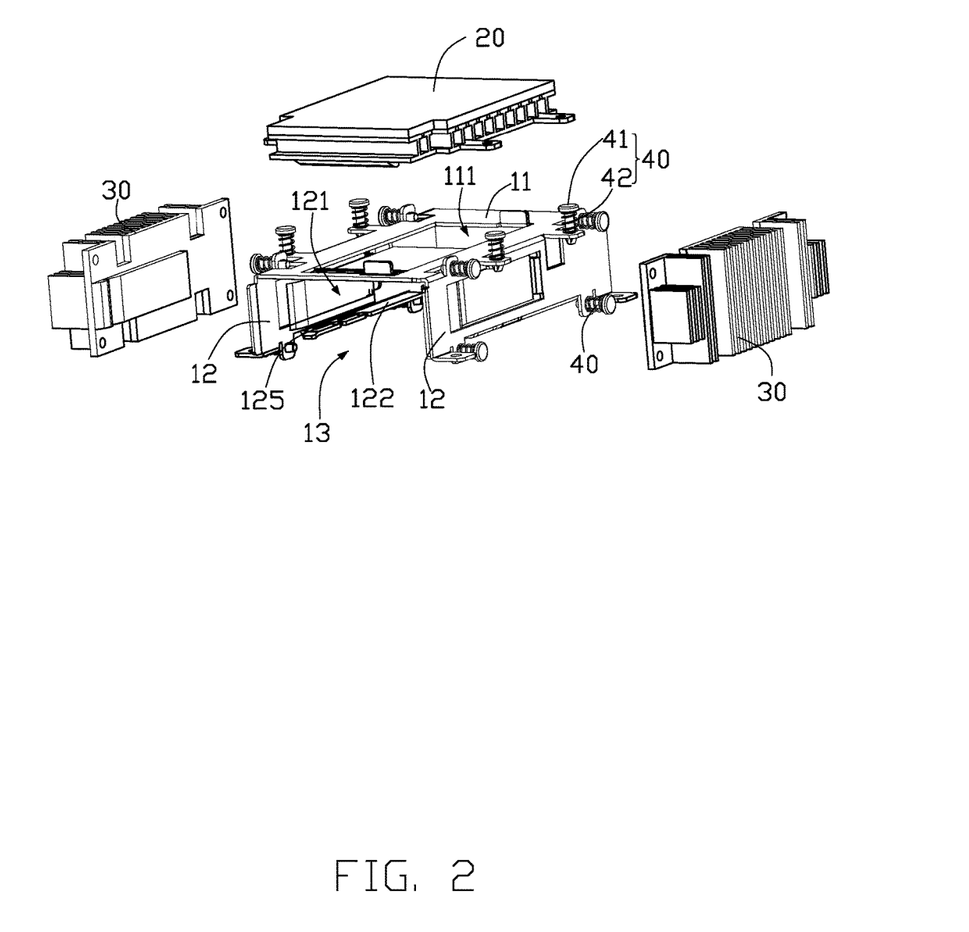
FIG. 2 is an exploded isometric view of the heat dissipation device of FIG. 1.

FIG. 1 and FIG. 2 show an embodiment of a heat dissipation device 100 according to the present disclosure. The heat dissipation device 100 radiates heat from a pluggable module 200, so that the pluggable module 200 can maintain a proper temperature. The heat dissipation device 100 can include a mounting bracket 10, an upper radiator 20, and at least one side radiator 30. The mounting bracket 10 can include an upper bracket 11 and two side brackets 12. The upper bracket 11 is arranged at an upper portion of the mounting bracket 10 and defines a first opening 111. Each of the side brackets 12 is perpendicular to the upper bracket 11 and extends downwards from the upper bracket 11, and the two side brackets 12 are arranged at two sides of the upper bracket 11. Each of the side brackets 12 defines a second opening 121. The mounting bracket 10 has a shape of an upside down U. The upper bracket 11 and the two side brackets 12 cooperatively define a receiving chamber 13 for receiving the pluggable module 200. The upper radiator 20 is arranged above the upper bracket 11 and configured for radiating heat generated from an upper portion of the pluggable module 200. The at least one side radiator 30 is arranged at one side of the side bracket 12 away from the receiving chamber 13 and configured for radiating heat generated from a side of the pluggable module 200. In at least one embodiment, the side radiator 30 can include one or two radiators. Preferably, there are two side radiators 30, mounted to the two side brackets 12.

In other embodiments, the heat dissipation device 100 may further include a radiator behind the mounting bracket 10 to increase the heat dissipation efficiency.

In other embodiments, the heat dissipation device 100 may include one radiator selected from the upper radiator 20 and the side radiator 30.

Figure 3:
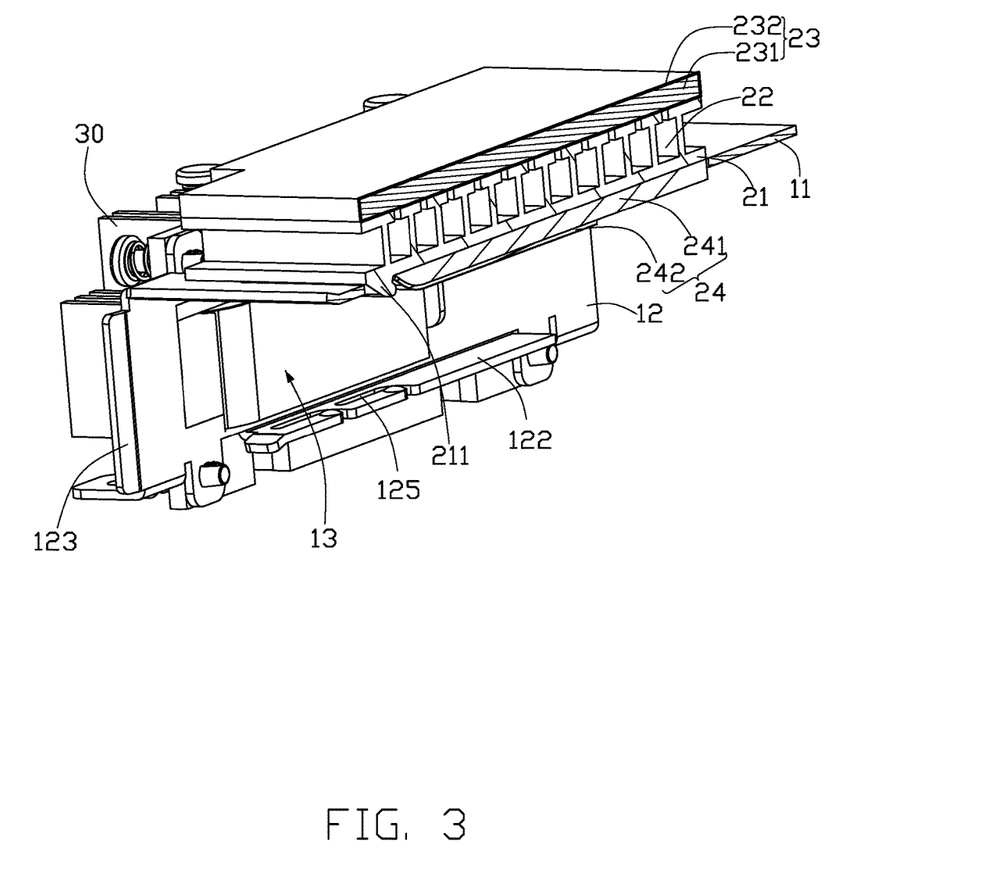
FIG. 3 is a cross-sectional view of the heat dissipation device of FIG. 1.
Figure 4:
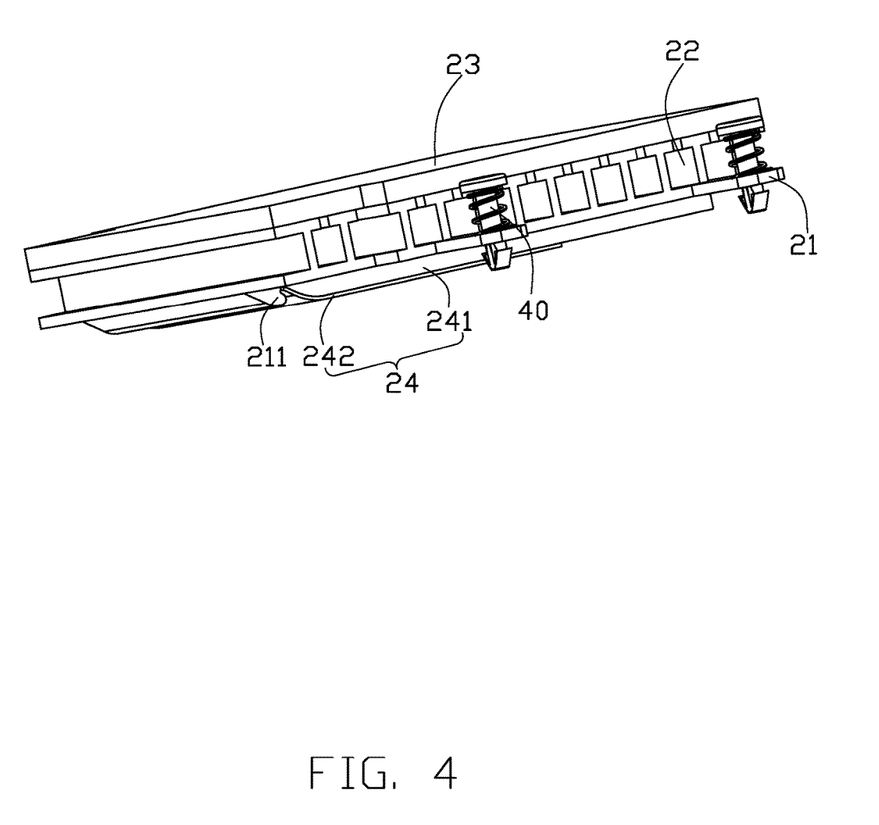
FIG. 4 is an isometric view of an upper radiator of the heat dissipation device of FIG. 2.

FIG. 3 and FIG. 4 show that the upper radiator 20 includes a first connecting plate 21, a plurality of heat conductors 22, and a heat conducting layer 23. The first connecting plate 21 is positioned above the upper bracket 11 and parallel to the upper bracket 11. The heat conductors 22 are arranged between the first connecting plate 21 and the heat conducting layer 23, and the heat conductors 22 are perpendicular to the upper bracket 11 and spaced from each other. The plurality of heat conductors 22 provide support to the heat conductive layer 23. Preferably, the heat conductors 22 can be made of metal or heat-resistant rigid plastic.

A bottom surface of the first connecting plate 21 is fitted with a first heat dissipation layer 24. A thickness of the first heat dissipation layer 24 increases gradually from one end toward the inside of the receiving chamber 13. After the thickness of the first heat dissipation layer 24 achieves a certain value, the first heat dissipation layer 24 extend horizontally to another end with a constant thickness. A front portion of the first heat dissipation layer 24 is curved. The first heat dissipation layer 24 can include a first heat dissipation rubber layer 241, and a first heat conductive thin film 242. The first heat dissipation rubber layer 241 can be connected to the first connecting plate 21. The first heat conductive thin film 242 can be bonded to one side of the first heat dissipation rubber layer 241 away from the heat conductors 22. The first heat conductive thin film 242 can be an aluminum foil, a fiber heat-conducting film, or other heat-conducting film.

One end of the first connection plate 21 includes a first guiding portion 211. The first guiding portion 211 is arranged towards one end of the receiving chamber 13 for inserting the pluggable module 200. A thickness of the first guiding portion 211 increases gradually from one end toward the inside of the receiving chamber 13, for inserting the pluggable module 200. The first guiding portion 211 is arranged adjacent to one end of the first heat dissipation layer 24 for inserting the pluggable module 200. In use, the pluggable module 200 abuts the first guiding portion 211 and is moved into the receiving chamber 13 of the mounting bracket 10 along the curved portion of the first heat dissipation layer 24. Thus, the first heat dissipation rubber layer 241 may not be peeled or pulled off by the pluggable module 200, so the heat dissipation effect is not affected due to structural deformations. When the pluggable module 200 is pulled out, the pluggable module 200 can be moved outward along the curved portion of the first heat dissipation layer 24, without pulling away the first heat dissipation rubber layer 241.

The first heat dissipation layer 24 extends through the first opening 111 of the upper bracket 10 to contact the pluggable module 200. As the first heat dissipation layer 24 is in contact with a top surface of the pluggable module 200, the heat conducting efficiency and speed may be enhanced. Costs of material and manufacture may be reduced.

In at least one embodiment, the heat conducting layer 23 can include a thermally conductive foam 231 and a graphite layer 232. The thermally conductive foam 231 and the graphite layer 232 each has a good thermal conductivity. In at least one embodiment, the graphite layer 232 can be arranged around the thermally conductive foam 231. The graphite layer 232 can be packaged on a top surface, a bottom surface, and side surfaces of the thermally conductive foam 231. The thermally conductive foam 231 has a certain thickness and a low cost, and the thermally conductive foam 231 can increase the heat dissipation efficiency. The thermally conductive foam 231 can also self-restore to an original shape after being compressed. In use, the thermally conductive foam 231 can be deformed to a degree when the heat dissipation device 100 is subjected to external shock or pressure. The structure of the heat dissipation device 100 is stable. After the shock or pressure is relieved, the heat conducting layer 23 returns to the original shape. In at least one embodiment, the graphite layer 232 can be a complete continuous layer, and the thermal foam 231 can be aluminum foil foam.

In other embodiments, the graphite layer 232 can be arranged at the top surface of the thermal foam 231, and/or arranged at the bottom surface of the thermal foam 231.

The heat conducting layer 23 is made of a combination of the thermal foam 231 and the graphite layer 232. The heat conducting layer 23 may have an improved heat dissipation efficiency, reduced weight, and decreased thickness of the heat dissipating member.

Figure 5:
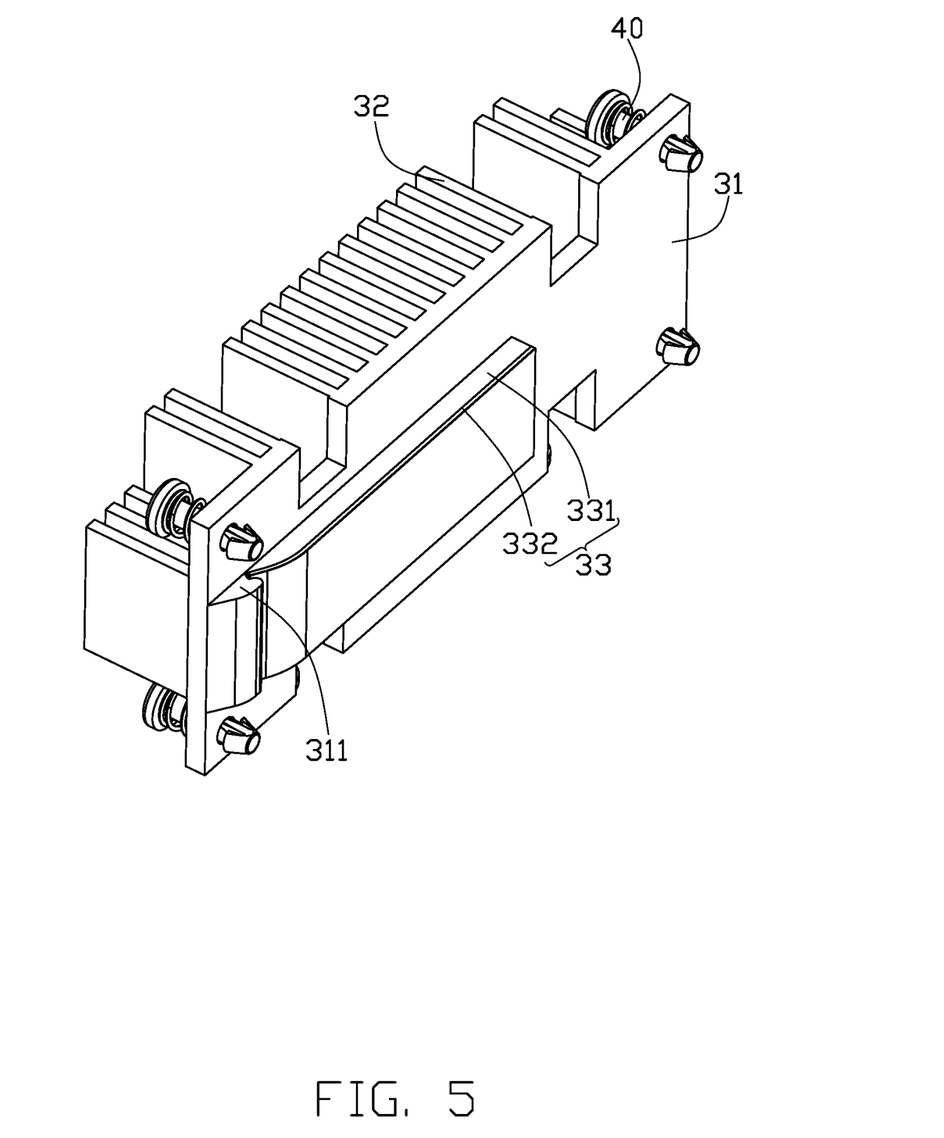
FIG. 5 is an isometric view of a side radiator of the heat dissipation device of FIG. 2.
Figure 6:
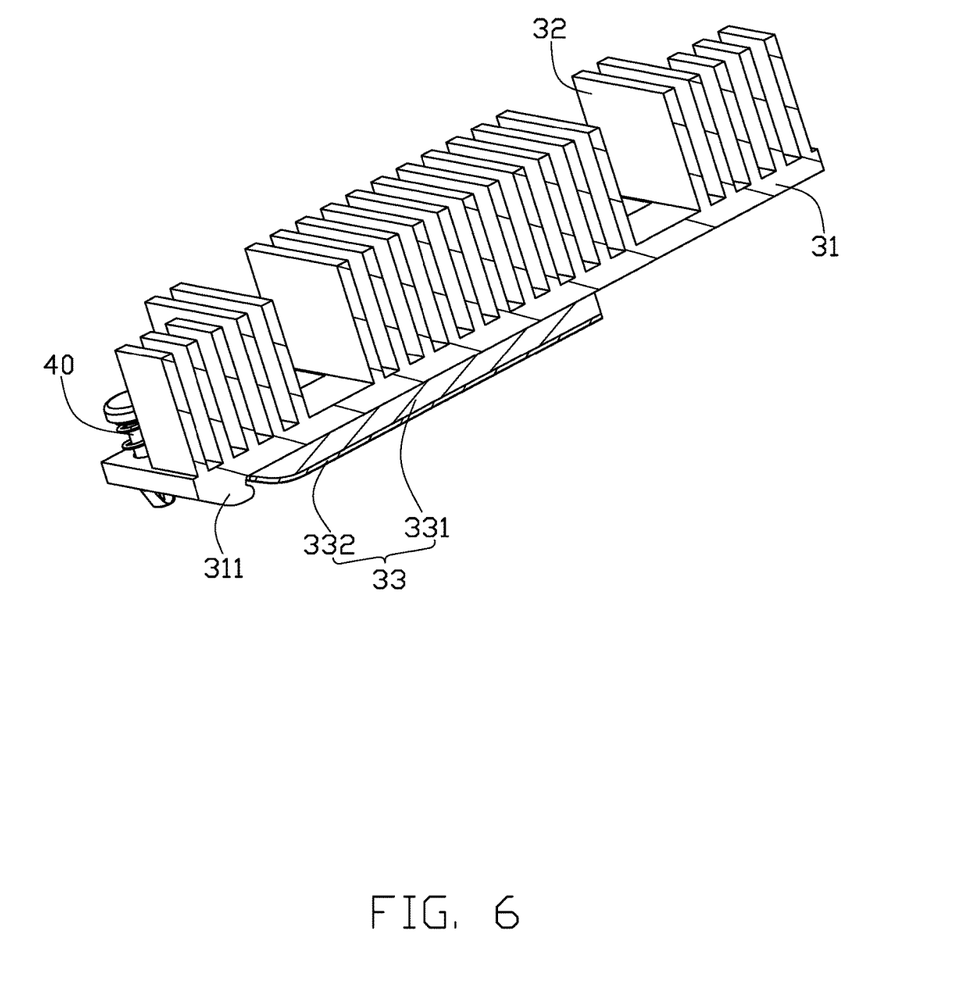
FIG. 6 is a cross-sectional view of the side radiator of FIG. 5.

FIG. 5 and FIG. 6 show that the side radiator 30 includes a second connecting plate 31 and a plurality of cooling fins 32. The second connecting plate 31 can be fixed to the side bracket 12. The cooling fins 32 can be arranged parallel to each other and perpendicular to the second connecting plate 31.

One side of the second connecting plate 31 can be fitted with a second heat dissipation layer 33. The second heat dissipation layer 33 can include a second heat dissipation rubber layer 331 connected to the second connecting plate 31, and a second heat conductive thin film 332 bonded to a side of the second heat dissipation rubber layer 331 away from the cooling fins 32. The second heat conductive thin film 332 can be an aluminum foil, a fiber heat-conducting film, or other heat-conducting film.

A thickness of the second heat dissipation layer 33 increases gradually from one end toward the inside of the receiving chamber 13. After the thickness of the second heat dissipation layer 33 achieves a certain value, the second heat dissipation layer 33 is extended longitudinally in a constant thickness to the inside of the receiving chamber 13. Similar to the first heat dissipation layer 24, a front portion of the second heat dissipation layer 33 is curved. The second connecting plate 31 has a structure similar to that of the first connecting plate 21. The second connecting plate 31 can include a second guiding portion 311 protruding out of one end of the second connecting plate 31. A thickness of the second guiding portion 311 increases from one end to the inside of the receiving chamber 13 for inserting the pluggable module 200 receiving chamber. The second guiding portion 311 can be arranged adjacent to one end of the second heat dissipation layer 33 for inserting the pluggable module 200. In use, the pluggable module 200 abuts the second guiding portion 311 and is moved into the receiving chamber 13 of the mounting bracket 10 along the curved portion of the second heat dissipation layer 33. Thus, the second heat dissipation rubber layer 331 may not be peeled or pulled by the pluggable module 200, and the heat dissipation effect is not affected. When the pluggable module 200 is pulled out, the pluggable module 200 can be moved outward along the curved portion of the second heat dissipation layer 33, without pulling on the second heat dissipation rubber layer 331.

Referring to FIG. 2 to FIG. 5, the second opening 121 is defined at the side bracket 12 toward the second heat dissipation layer 33. The second heat dissipation layer 33 extend through the second opening 121 to contact the pluggable module 200. As the second heat dissipation layer 33 is in contact with a side of the pluggable module 200, the heat conducting efficiency and the heat dissipation speed are increased, with reduced use of materials and manufacturing cost.

Referring to FIG. 2 to FIG. 7, the upper radiator 20 and the side radiator 30 are fixed to the mounting bracket 10 by connecting members 40. Each of the connecting member 40 can include a bolt 41 and a spring 42 surrounding the bolt 41. The mounting bracket 10 can further define a plurality of fixing holes 101. Each of the connecting members 40 extends through the first connecting plate 21 and a corresponding one of the fixing holes 101 of the upper bracket 11 to fix the first connecting plate 21 to the upper bracket 11. The connecting members 40 extend through the second connecting plate 31 and the fixing holes 101 of the upper bracket 11 to fix the second connecting plate 31 to the side bracket 12.

FIG. 2 further shows that the side bracket 12 includes a positioning plate 122 extending horizontally from a bottom portion of the side bracket 12 towards the receiving chamber 13. The positioning plate 122 vertically limits the pluggable module 200. The side bracket 12 can further include at least one elastic positioning piece 125 extending longitudinally on the positioning plate 122. The at least one elastic positioning piece 125 can be integrally formed with the positioning plate 122. In other embodiments, the at least one elastic positioning piece 125 can be connected to the positioning plate 122.

When inserting the pluggable module 200 into the mounting bracket 10, the upper portion of the pluggable module 200 abuts the first connecting plate 21, and the spring 42 of the connecting member 40 between the upper bracket 11 and the first connecting plate 21 applies a positive force to the pluggable module 200. The elastic positioning pieces 125 apply a positive pressure to maintain the installation stability of the pluggable module 200, and keep the pluggable module 200 in contact with the first heat dissipation layer 24, to improve the heat dissipation effect. Furthermore, the elastic positioning pieces 125 can absorb some shock impacts and pressure.

Figure 7:
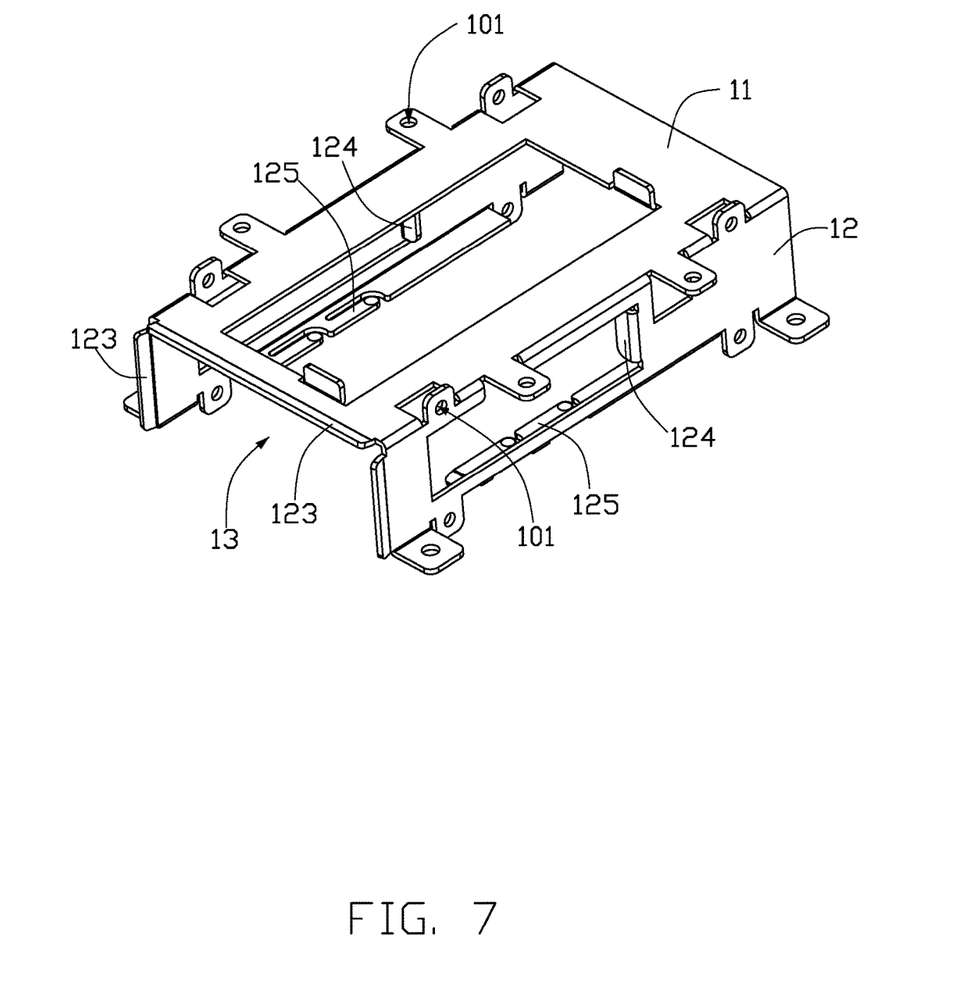
FIG. 7 is an isometric view of a mounting bracket of the heat dissipation device of FIG. 2.

FIG. 7 shows that one end of the mounting bracket 10 includes a guiding piece 123 for inserting the pluggable module 200. The guiding piece 123 can be connected to and inclined to the upper bracket 11, or the side bracket 12. The guiding piece 123 can be used to locate the pluggable module 200 during insertion into the mounting bracket 10. The mounting bracket 10 further includes a limiting piece 124 arranged at one end of the second opening 121 away from the inserting end. The limiting piece 124 extends toward the receiving chamber 13 and limits the placement and position of the pluggable module 200.

The heat dissipation device 100 for the pluggable module 200 includes the upper radiator 20 and at least one side radiator 30. The heat dissipation device 100 comprising the heat conducting layer 23 and the cooling fins 32 has a simple structure, and a high heat dissipation efficiency. The heat dissipation device 100 may limit a temperature of the chip in the pluggable module 200 to about 90 degrees Celsius.

Furthermore, the heat conducting layer 23 includes the thermally conductive foam 231 and the graphite layer 232. The heat conducting layer 23 improves the heat dissipation efficiency, reduces the weight, and decreases the thickness of the heat dissipating member.

It is to be understood, however, that even through numerous characteristics and advantages of the present disclosure have been set forth in the foregoing description, together with details of assembly and function, the disclosure is illustrative only, and changes may be made in details, especially in the matters of shape, size, and arrangement of parts within the principles of the disclosure to the full extent indicated by the broad general meaning of the terms in which the appended claims are expressed.

What is claimed is:

1. A heat dissipation device applicable in a pluggable device or module, comprising:
   a mounting bracket, comprising an upper bracket and two side brackets connected to two sides of the upper bracket, the upper bracket and the two side brackets cooperatively define a receiving chamber configured for receiving the pluggable module;
   an upper radiator positioned above the upper bracket; and
   at least one side radiator positioned at one side of the side bracket away from the receiving chamber;
   wherein the upper radiator comprises:
      a heat conducting layer comprising a thermally conductive foam and a graphite layer arranged around the thermally conductive foam;
      a first connecting plate positioned above the upper bracket, wherein a bottom surface of the first connecting plate is fitted with a first heat dissipation layer, and a thickness of one end of the first heat dissipation layer increases gradually from one end toward the inside of the receiving chamber, and
      a plurality of heat conductors arranged between the first connecting plate and the heat conducting layer, the plurality of the heat conductors being perpendicular to the upper bracket and spaced from each other; and
   wherein the first heat dissipation layer comprises a first heat dissipation rubber layer connected to the first connecting plate, and a first heat conductive thin film bonded to a side of the first heat dissipation rubber layer away from the heat conductors.

2. The heat dissipation device of claim 1, wherein the upper bracket defines a first opening, and the first heat dissipation layer extends through the first opening to contact the pluggable module.

3. The heat dissipation device of claim 1, wherein one end of the first connecting plate comprises a first guiding portion, and a thickness of the first guiding portion increases gradually from one end toward the inside of the receiving chamber, for inserting the pluggable module of the receiving chamber; and
   wherein the first guiding portion is arranged adjacent to one end of the first heat dissipation layer.

4. A heat dissipation device applicable in a pluggable device or module, comprising:
   a mounting bracket, comprising an upper bracket and two side brackets connected to two sides of the upper bracket, the upper bracket and the two side brackets cooperatively define a receiving chamber configured for receiving the pluggable module;
   an upper radiator positioned above the upper bracket; and
   at least one side radiator positioned at one side of the side bracket away from the receiving chamber, wherein:
      the upper radiator comprises a heat conducting layer, and the heat conducting layer comprises a thermally conductive foam and a graphite layer arranged around the thermally conductive foam;
      the side radiator comprises a second connecting plate fixed to the side bracket and a plurality of cooling fins, the plurality of cooling fins are arranged parallel to each other and perpendicular to the second connecting plate, one side of the second connecting plate is fitted with a second heat dissipation layer, and a thickness of the second heat dissipation layer increases gradually from one end toward the inside of the receiving chamber;
      the second heat dissipation layer comprises a second heat dissipation rubber layer connected to the second connecting plate, and a second heat conductive thin film bonded to a side of the second heat dissipation rubber layer away from the plurality of cooling fins; and
      the side bracket defines a second opening, and the second heat dissipation layer extends through the second opening to contact the pluggable module.

5. The heat dissipation device of claim 4, wherein one end of the second connection plate comprises a second guiding portion, and a thickness of the second guiding portion increases gradually from one end toward the inside of the receiving chamber, for inserting the pluggable module; and
   wherein the second guiding portion is arranged adjacent to one end of the second heat dissipation layer.

6. The heat dissipation device of claim 4, wherein each of the two side brackets comprises:
   a positioning plate extending horizontally from a bottom portion of the side bracket towards the receiving chamber; and
   at least one elastic positioning piece extending longitudinally on the positioning plate.

7. The heat dissipation device of claim 4, wherein the upper radiator and the side radiator are fixed to the mounting bracket by a plurality of connecting members, and each of the plurality of connecting members comprises a bolt and a spring surrounding the bolt.

8. The heat dissipation device of claim 4, wherein the mounting bracket further comprises a limiting piece arranged at one end of the second opening away from the inserting end, and the limiting piece extends toward the receiving chamber and is configured to limit a position of the pluggable module.

9. A heat dissipation device applicable in a pluggable device or module, comprising:
- a mounting bracket, comprising an upper bracket and two side brackets respectively connected to two sides of the upper bracket, the upper bracket and the two side brackets cooperatively define a receiving chamber configured for receiving the pluggable module;
- an upper radiator positioned above the upper bracket; and
- at least one side radiator positioned at one side of the side bracket away from the receiving chamber,
- wherein the upper radiator comprises:
  - a heat conducting layer comprising a thermally conductive foam and a graphite layer arranged around the thermally conductive foam;
  - a first connecting plate positioned above the upper bracket, wherein a bottom surface of the first connecting plate is fitted with a first heat dissipation layer, and
  - a plurality of heat conductors arranged between the first connecting plate and the heat conducting layer, the plurality of the heat conductors being perpendicular to the upper bracket and spaced from each other; and
- wherein the first heat dissipation layer comprises a first heat dissipation rubber layer connected to the first connecting plate, and a first heat conductive thin film bonded to a side of the first heat dissipation rubber layer away from the heat conductors.

* * * * *